United States Patent
Gottwald et al.

(10) Patent No.: US 9,913,378 B2
(45) Date of Patent: Mar. 6, 2018

(54) ELECTRONIC SUB-ASSEMBLY, A METHOD FOR MANUFACTURING THE SAME, AND A PRINTED CIRCUIT BOARD WITH ELECTRONIC SUB-ASSEMBLY

(71) Applicant: Schweizer Electronic AG, Schramberg (DE)

(72) Inventors: Thomas Gottwald, Dunningen (DE); Alexander Neumann, Rottweil (DE)

(73) Assignee: SCHWEIZER ELECTRONIC AG, Schramberg (DE)

( * ) Notice: Subject to any disclaimer, the term of this patent is extended or adjusted under 35 U.S.C. 154(b) by 215 days.

(21) Appl. No.: 14/772,329

(22) PCT Filed: Mar. 11, 2014

(86) PCT No.: PCT/EP2014/000631
§ 371 (c)(1),
(2) Date: Sep. 2, 2015

(87) PCT Pub. No.: WO2014/139666
PCT Pub. Date: Sep. 18, 2014

(65) Prior Publication Data
US 2016/0014901 A1  Jan. 14, 2016

(30) Foreign Application Priority Data
Mar. 13, 2013  (DE) .......... 10 2013 102 541

(51) Int. Cl.
*H05K 7/10* (2006.01)
*H05K 7/12* (2006.01)
(Continued)

(52) U.S. Cl.
CPC .......... *H05K 1/181* (2013.01); *H01L 23/142* (2013.01); *H01L 23/3677* (2013.01);
(Continued)

(58) Field of Classification Search
CPC ......... H01L 2924/0002; H01L 2924/00; H01L 23/142; H01L 23/3677; H01L 23/5389;
(Continued)

(56) References Cited

U.S. PATENT DOCUMENTS

| 4,835,598 A | 5/1989 | Higuchi et al. |
| 2001/0038140 A1* | 11/2001 | Karker .................. H01L 23/057 257/666 |

(Continued)

FOREIGN PATENT DOCUMENTS

| DE | 10 2010 060 855 | 5/2012 |
| DE | 102010060855 | * 5/2012 |

(Continued)

OTHER PUBLICATIONS

The International Bureau, International Preliminary Report on Patentability, Chapter 1, dated Sep. 24, 2015, PCT/EP2014/000631, filed Mar. 11, 2014.
(Continued)

*Primary Examiner* — Yuriy Semenenko
(74) *Attorney, Agent, or Firm* — Shlesinger, Arkwright & Garvey LLP

(57) ABSTRACT

Electronic sub-assembly comprising a carrier layer and a mounting area with at least one electronic component, wherein the carrier layer has at least in portions a material with a low coefficient of thermal expansion to adjust the coefficient of thermal expansion of the carrier layer, and wherein at least one compensation layer is provided on the carrier layer adjacent to the installation area, on which compensation layer an electrically insulating, thermally conductive layer and at least one electrically conductive layer are provided.

16 Claims, 10 Drawing Sheets

(51) Int. Cl.
  *H05K 1/18* (2006.01)
  *H01L 23/14* (2006.01)
  *H01L 23/367* (2006.01)
  *H01L 23/538* (2006.01)
  *H05K 1/02* (2006.01)
  *H05K 1/11* (2006.01)
  *H05K 3/00* (2006.01)
  *H05K 3/28* (2006.01)
  *H05K 3/32* (2006.01)
  *H05K 3/42* (2006.01)

(52) U.S. Cl.
  CPC ....... *H01L 23/5389* (2013.01); *H05K 1/0201* (2013.01); *H05K 1/111* (2013.01); *H05K 3/0047* (2013.01); *H05K 3/0094* (2013.01); *H05K 3/284* (2013.01); *H05K 3/32* (2013.01); *H05K 3/42* (2013.01); *H01L 2924/0002* (2013.01); *H05K 2201/09036* (2013.01)

(58) Field of Classification Search
  CPC ...... H05K 1/0201; H05K 1/111; H05K 1/181; H05K 2201/09036; H05K 3/0047; H05K 3/0094; H05K 3/284; H05K 3/32; H05K 3/42
  See application file for complete search history.

(56) References Cited

U.S. PATENT DOCUMENTS

| | | | |
|---|---|---|---|
| 2003/0127715 A1* | 7/2003 | Liu | H01L 21/4871 257/678 |
| 2006/0170101 A1* | 8/2006 | Kaizuka | H01L 23/3677 257/738 |
| 2007/0074900 A1* | 4/2007 | Lee | H05K 1/185 174/260 |
| 2008/0251903 A1* | 10/2008 | Otremba | H01L 23/5389 257/678 |
| 2013/0329370 A1* | 12/2013 | Gottwald | H01L 23/5389 361/720 |

FOREIGN PATENT DOCUMENTS

| | | |
|---|---|---|
| EP | 0 121 374 | 10/1984 |
| WO | WO 01/13823 | 3/2000 |
| WO | WO 01/78109 | 10/2001 |

OTHER PUBLICATIONS

Office Action, Corresponding Chinese application 201480025043.3, dated May 26, 2017.

* cited by examiner

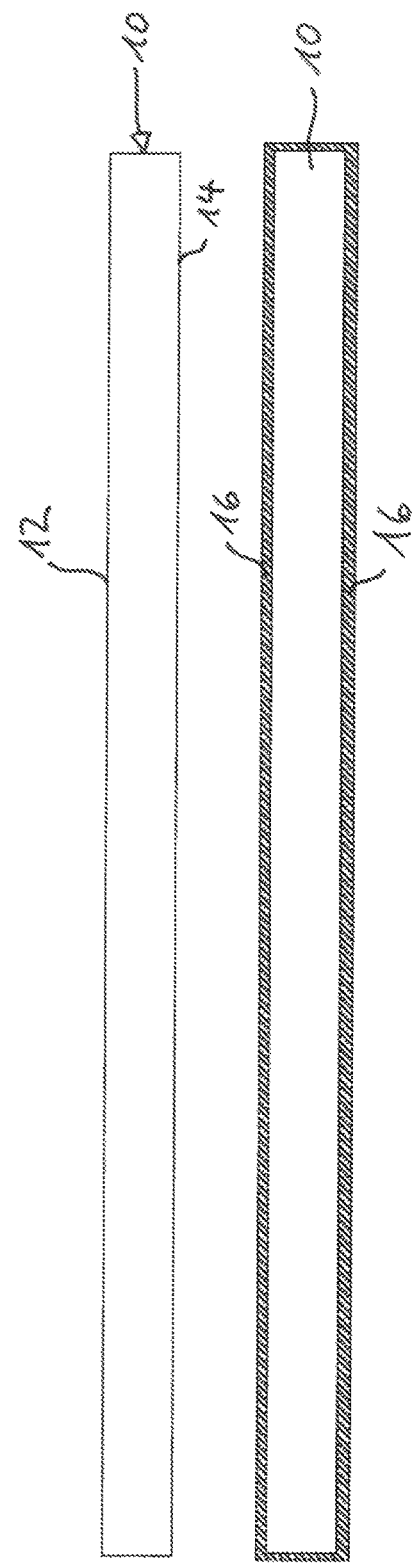

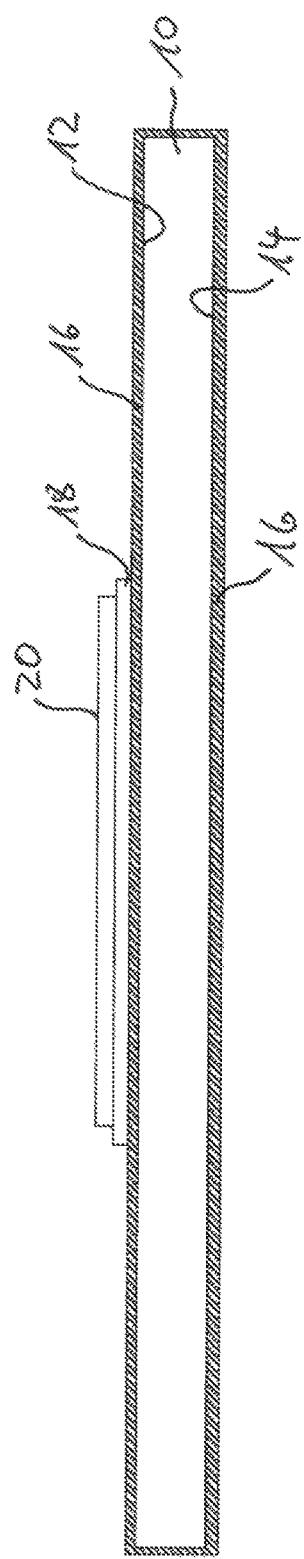

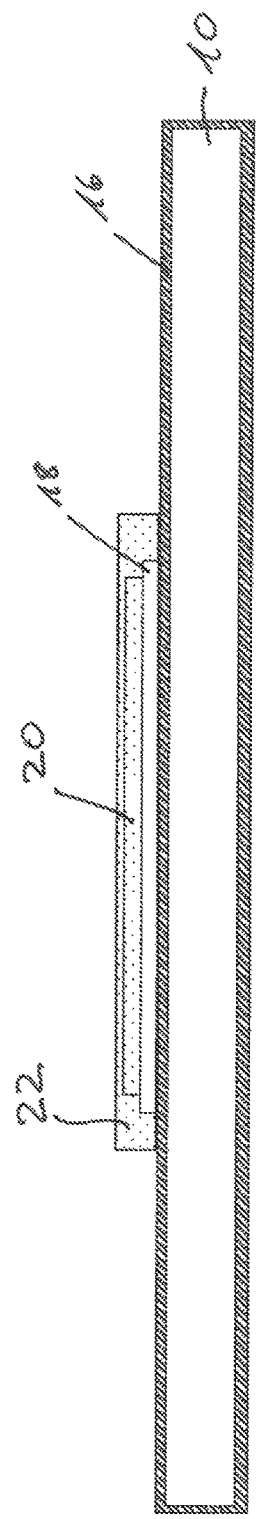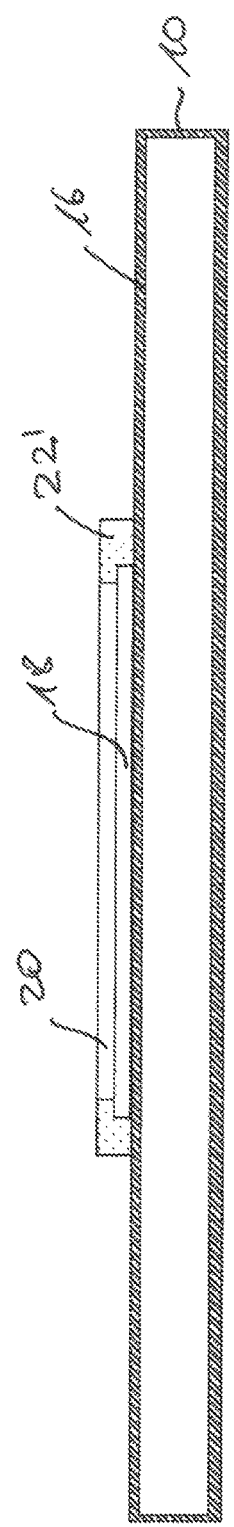

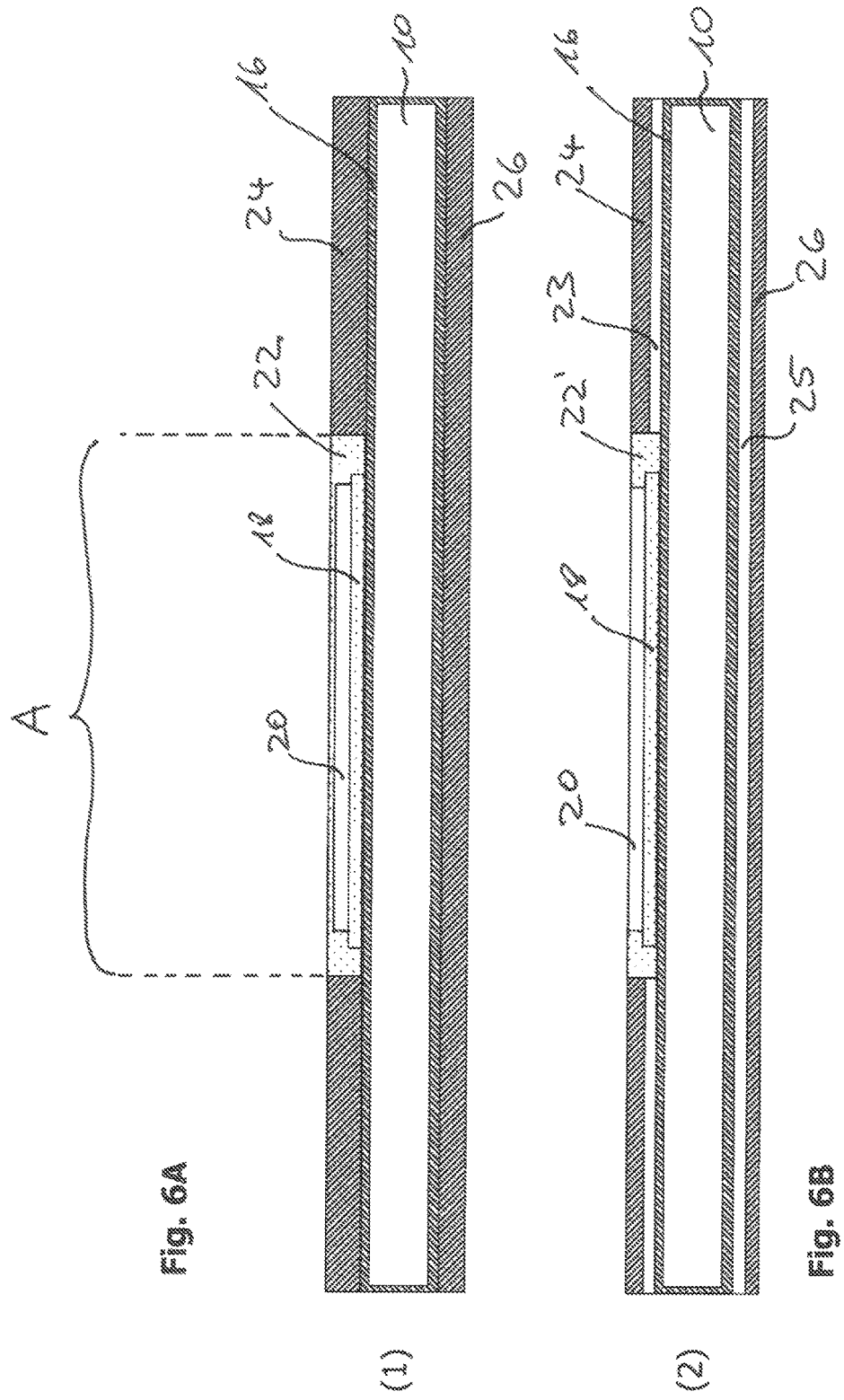

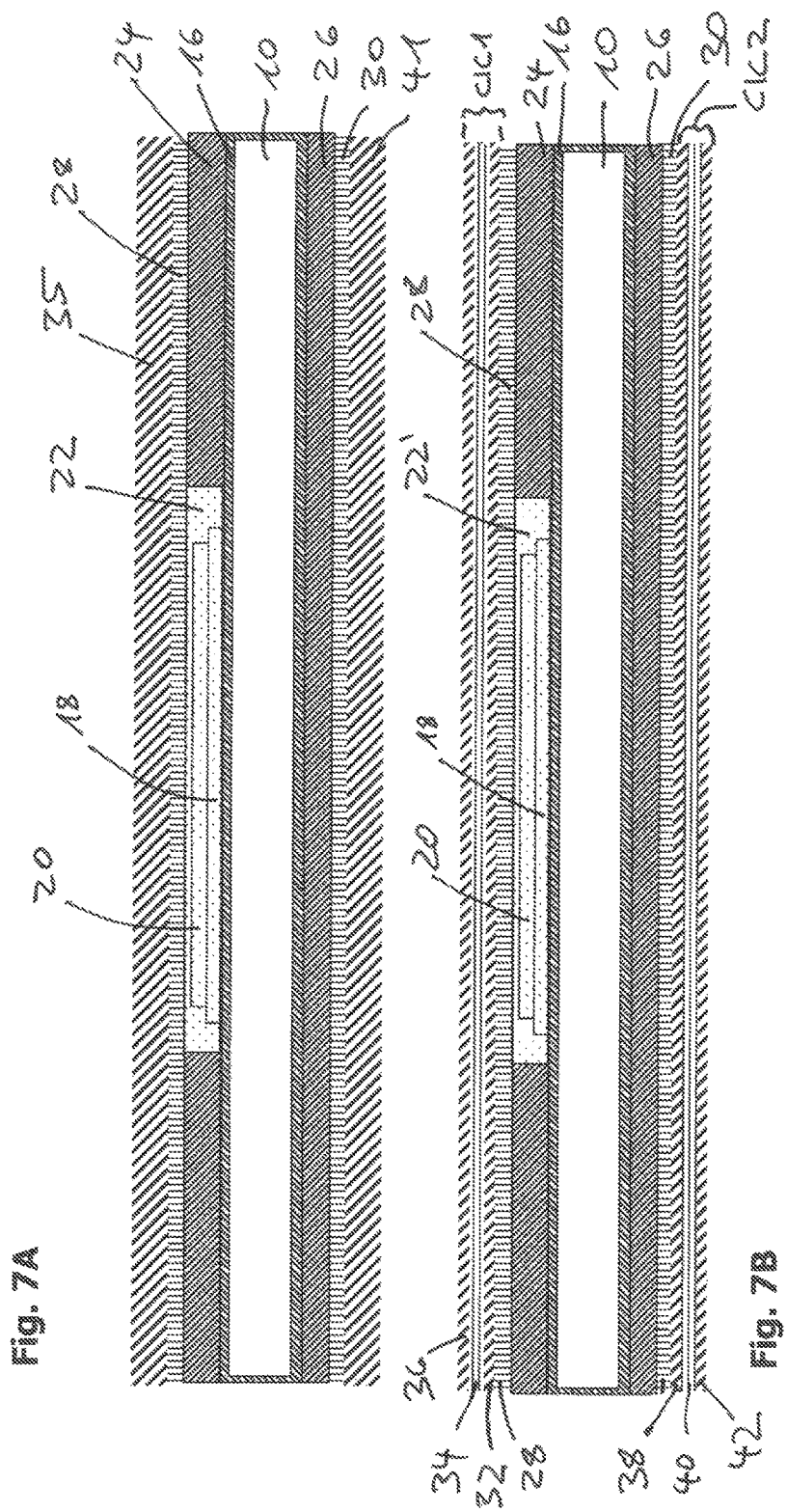

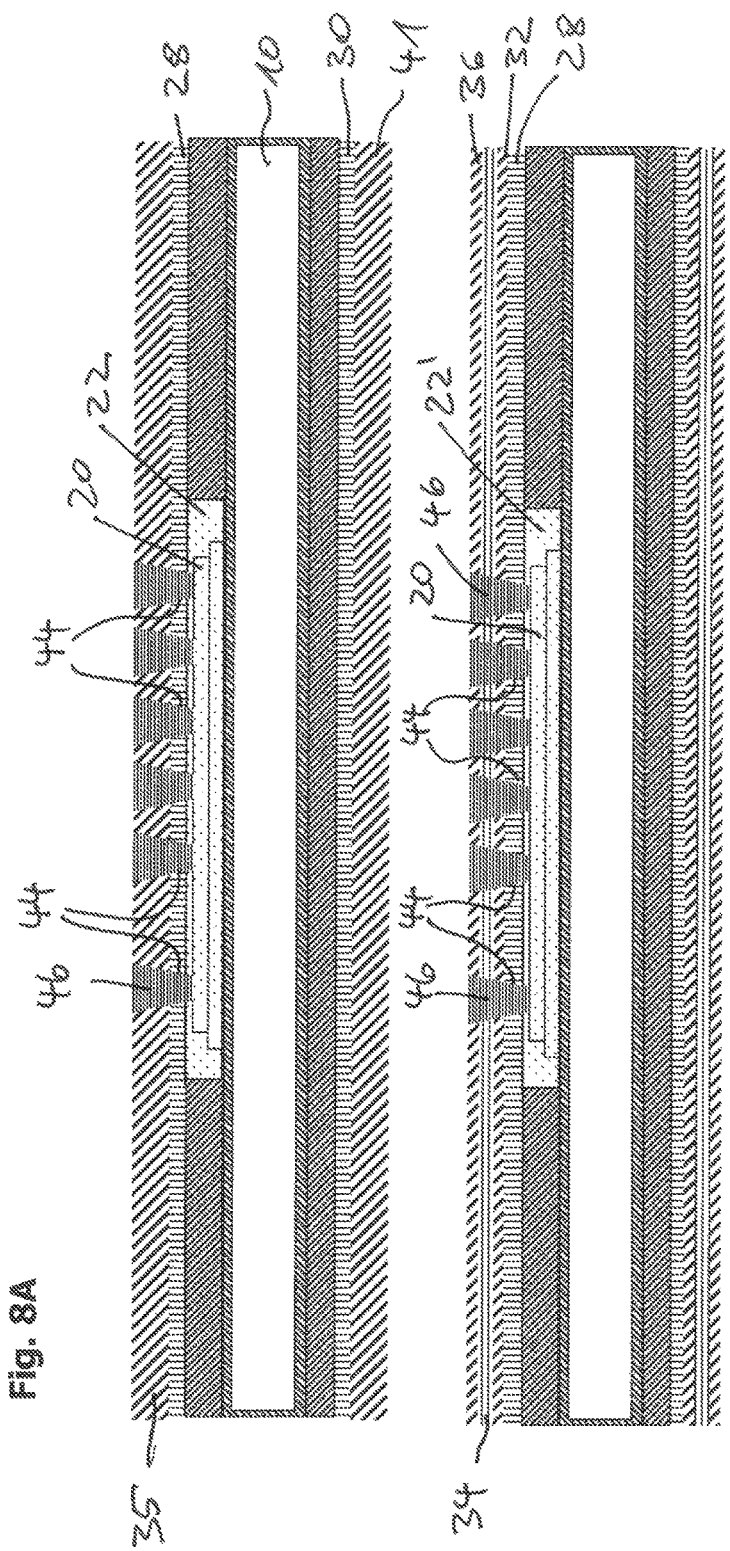

ELECTRONIC SUB-ASSEMBLY, A METHOD FOR MANUFACTURING THE SAME, AND A PRINTED CIRCUIT BOARD WITH ELECTRONIC SUB-ASSEMBLY

FIELD OF THE INVENTION

The present invention relates to an electronic sub-assembly as well as a method for manufacturing the same.

BACKGROUND OF THE INVENTION

A method is known from DE 10 2009 013 818 A1 for manufacturing an electronic device wherein, after preparing a carrier with a first conductive layer, a first insulating layer is applied on this first conductive layer and at least one through connection is created from a first side of the first insulating layer to a second side of the first insulating layer. At least two semiconductor chips are installed on the carrier and a second insulating layer is applied over the carrier. The second insulating layer is then opened until the carrier is exposed, and a metal layer is deposited on the exposed second insulating layer, after which the two or more semiconductor chips are separated.

From DE 10 2010 060 855 A1 an electronic sub-assembly is known comprising an electrically conductive core layer with a first layer composed of electrically conductive material, said first layer being applied on both sides, and with at least one electronic component arranged in a recess of the first layer. The first layer is covered in each case with an electrically insulating, thermally conductive layer, and a further layer composed of electrically conductive material is provided in each case on the thermally conductive layer, said further layer being coated in each case with a cover layer composed of electrically conductive material.

Furthermore, through connections made of the material of the cover layer are provided, the connections extending through the electrically insulating, thermally conductive layer covering the electronic component and the further layer made of electrically and thermally conductive material for the purpose of contacting the electronic component.

SUMMARY OF THE INVENTION

In contrast thereto, the present invention proposes an electronic sub-assembly as disclosed herein, a method for manufacturing the sub-assembly as disclosed herein, as well as a printed circuit board with a sub-assembly according to the invention.

The basic idea of the invention is to provide, for an electronic sub-assembly, a carrier layer, the coefficient of thermal expansion of which is adjusted to that of the electronic component (e.g. a chip) to be mounted (i.e. to be placed on the carrier). The difference in coefficients of thermal expansion between the substrate and the chip(s) is thus reduced in accordance with the invention, resulting in improved reliability. The electronic sub-assembly in accordance with the invention represents a cost-effective and also more reliable alternative to the prior art.

This is achieved by the use of other materials for the carrier layer of the electronic sub-assembly. The selection criterion for the material of the carrier layer is a low coefficient of thermal expansion in order to achieve a high level of dimensional stability of the core layer when subjected to temperature changes, such as they occur e.g. during soldering. Within the meaning of the present invention, a "low coefficient of thermal expansion" is to be understood as an especially or even anomalously low coefficient of thermal expansion for at least certain temperature ranges. An example of this is the iron-nickel alloy FeNi36, also known under the trademark Invar®. However, further alloys fulfilling the conditions described are known to a person skilled in the art, such as Fe65Ni35 or Fe-33-Ni4.5Co, which displays a further reduced coefficient of expansion through the addition of approximately 5% cobalt to the alloy. Copper-molybdenum alloys are also possible. Inovco® and Kovar® are examples of well-known commercially available alloys. One skilled in the art also uses the term "CTE-optimized alloys".

In accordance with the invention, the coefficient of thermal expansion of the core layer is adjusted to the electronic component intended for mounting. Such matching may be done by optimizing, on the one hand, the low coefficient of expansion, with the effect of increased lifespan, and, on the other, the electrical and thermal characteristics, in order to be able to operate the sub-assembly at high performance. Invar is a poor thermal and electrical conductor.

For the design of the carrier layer in accordance with the invention, several options present themselves: A core layer of electrically conductive material can be coated with a layer of material with a low coefficient of thermal expansion; a further variant provides for a core layer of a material having a low coefficient of thermal expansion, coated with a layer of electrically conductive material; finally, it is also possible to permeate, at least in sections, a core layer of an electrically conductive material with a material having a low coefficient of thermal expansion, or vice versa. Particular suitable for this permeation is the mounting area of the carrier layer on which, in a subsequent installation step, the electronic component against which the overall coefficient of expansion will be adjusted is placed. These variants can also be combined.

At least one electronic component, such as for example a power semiconductor or similar, is mounted on at least one mounting area of the core layer of the material with a low coefficient of thermal expansion. Alternatively, the core layer is plated on both sides with an electrically conductive first layer prior to the mounting. This plating may be necessary or beneficial with some core layer materials, and may under some circumstances not be necessary with other materials. The material of the first layer applied to the core layer (or also the plating layer) has (at least in some temperature ranges) a higher coefficient of thermal expansion than the core layer. The material of the first layer is generally copper, but other suitable materials known to the person skilled in the art may also be used.

Conversely, a first layer of a material with a coefficient of expansion lower than that of the core material, such as FeNi36, can be deposited on a core layer of, e.g., copper having a high coefficient of expansion. This deposition may be performed e.g. galvanically.

This may also be accomplished in that solids or particles such as SiC having a very low coefficient of expansion are incorporated into the (galvanic) coating in the (galvanic) deposition process. The incorporation of this solid particulate results in an overall lower coefficient of expansion than that of the galvanic coating alone. If, during the deposition process, the proportion of incorporated solid particulates is successively increased, the coefficient of expansion can gradually be altered from high to low, resulting in an even greater reliability of the final system of a carrier material having a high coefficient of expansion and a component to be mounted having a low coefficient of expansion.

In accordance with the invention, fine adjustment of the coefficient of thermal expansion can be made by selecting the ratio of the thickness of the core layer to that of the plating layer, in order to adjust the coefficient as precisely as possible to the parameters provided by the electronic component to be mounted. The lower the desired coefficient of expansion, the thicker the core layer selected.

As mentioned above, the core layer of the carrier layer can contain, at least in sections or portions, a material differing from that of the core layer. This enables further fine adjustment of the coefficient of thermal expansion.

The area of the core layer with a different material may be provided e.g. beneath the mounting area.

The area of the core layer with a different material may be formed e.g. by holes in the material of the core layer which are filled with galvanically deposited copper (or another suitable conductive material).

Additional advantages and embodiments of the invention become clear from the description and accompanying drawings.

It is evident that the features mentioned above and those yet to be explained below may be applied not only in the combinations indicated, but also in other combinations or individually, without going beyond the scope of the present invention.

The invention is represented for illustrative purposes by means of exemplary embodiments depicted via schematic drawings (not to scale), and is described in detail herein, with reference to the drawings.

BRIEF DESCRIPTION OF THE DRAWINGS

FIG. 1 shows a core layer of an electronic sub-assembly in accordance with the invention.

FIG. 2 shows the core layer of FIG. 1 with a first layer applied to both sides.

FIG. 4 shows the sequence of layers of FIG. 3 with a mounted component.

FIGS. 5A and 5B show two alternative embodiments of a component encapsulation.

FIGS. 6A and 6B show the two layer sequences of FIGS. 5A and 5B with a compensating layer applied thereto.

FIGS. 7A and 7B show the two layer sequences of FIGS. 6A and 6B, respectively, after being pressed together (laminated).

FIGS. 8A and 8B show the two layer sequences of FIGS. 7A and 7B, respectively, after the steps of hole creation and establishing of the through connection.

DETAILED DESCRIPTION OF THE INVENTION

Figure 3:
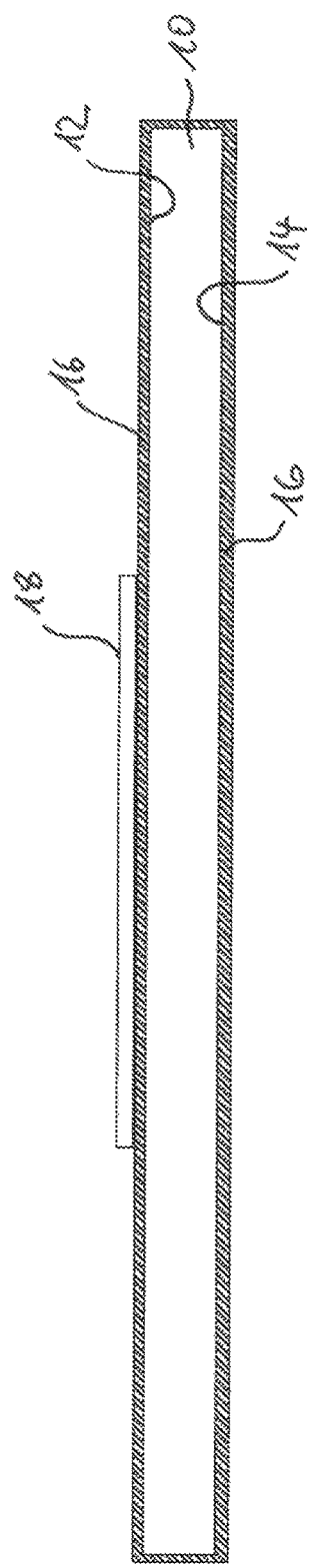
FIG. 3 shows the sequence of layers of FIG. 2 with a selectively plated surface for the component mounting.

FIG. 1 shows a core layer 10 for an electronic sub-assembly in accordance with the invention with an upper surface 12 and a lower surface 14. The core layer 10 of the exemplary embodiment depicted consists, in accordance with the invention, of a material with a low coefficient of thermal expansion, e.g. of a suitable iron-nickel alloy. However, providing as a core layer a standard electrically conductive material with a relatively high coefficient of thermal expansion, such as copper, is also within the scope of the invention.

In a next step, the core layer 10 is coated across its entire surface with a thin first layer 16 of an electrically conductive material, e.g. by plating (see FIG. 2). The first layer 16 is applied to the upper surface 12 and/or the lower surface 14 of the substrate 10. This application is accomplished e.g. by deposition (plating, galvanic/electrochemical deposition) or by other suitable technical means (e.g. sputtering, vacuum deposition, etc.) known to the skilled person. The thickness of the core layer 10 typically lies within a range of approximately 100 μm to approximately 500 μm. If the core layer consists e.g. of copper, a layer of a material with a low coefficient of thermal expansion is used as a further first layer.

Alternatively, a prefabricated commercially available CIC (copper-Invar-copper) layer produced by means of roll cladding may be used. Typical thicknesses of such a commercially available ready-made CIC layer are 150 μm of Invar® and 18 μm each of copper.

FIG. 3 depicts the sequence of layers of FIG. 2 with a mounting layer 18 applied to the first layer 16. The mounting layer 18 is only applied to portions of the first layer 16 at a designated mounting location (mounting area A). The mounting layer 18 may comprise, e.g., a layer of precious metal (such as Ag, Au, Sn, etc.), technically known as a "contact surface". The mounting layer is applied using a method known to one skilled in the art (selective plating by means of photolithography).

Optionally, the plating of the first layer 16 can be dispensed with, and mounting can be effected directly on the substrate 10 or on the mounting layer 18 applied to the substrate 10. In some applications, the precious metal layer 18 is not necessary, and the mounting can be effected directly on the carrier layer. In addition, in each of the variants discussed, adhesion-promoting layers known to one skilled in the art may also be provided in order to promote the effectiveness of the installation process.

In a next step, an electronic component 20 is mounted on the layer sequence of FIG. 2 or FIG. 3, respectively, (cf. FIG. 4). The electronic component 20 is, in particular, a power semiconductor, such as a MOSFET, IGBT, diodes, etc. Installation is performed by methods familiar to one skilled in the art, such as diffusion soldering, conductive gluing, normal soldering, etc. In the case of silver sintering, the contact surface 18 described above is necessary.

The installed electronic component 20 is then encapsulated with an encapsulation material 22 or 22', as depicted in FIGS. 5A and 5B, respectively. The encapsulation may be complete (FIG. 5A) or only on the sides of the subassemblies (FIG. 5B). Possible encapsulation materials can include, e.g., epoxy resins applied by means of silk-screening, stencil printing, or transfer molding. However, other organic resins containing fillers to optimize their coefficients of thermal expansion and thermal conductivity may also be considered.

For the purpose of height compensation, at least one compensation layer 24 is applied along the sides of the encapsulated component 20, i.e. around the mounting area A defined by the encapsulation 22, 22', the compensation layer having essentially the same height as the encapsulation 22, 22' (FIG. 6A). If desired, a prepreg layer 23 may be provided between the first layer 16 and the compensation layer 24, as illustrated in FIG. 6B. The latter may be helpful particularly in the case of thicker electronic components. For reasons of symmetry, the compensation layer may be applied to both sides.

The sequence of layers so created is pressed together (laminated) with a prepreg layer 28, 30 and a layer of a conductive material (such as copper foil) 35, 41 (FIG. 7A). Alternatively, a CIC layer 32, 34, 36 or 38, 40, 42, respectively, can be used in place of each layer of copper foil (as depicted in the exemplary embodiment of FIG. 7B), which permits a further adjustment of the coefficient of thermal expansion. Other materials or sequences of alloys are also possible, and it is of course also possible to create a hybrid form (not depicted) having a top CIC layer and a lower layer of copper foil; with such an asymmetric structure, an intentionally curved (convex or concave) form can be achieved for the electronic sub-assembly. Standard prepreg resin materials have a thermal conductivity ranging from approximately 0.2 to 0.3 W/mK. However, it is also possible to use materials with a thermal conductivity of 0.8 to 5.0 W/mK (thermally optimized prepreg layer).

It follows from the method sequence described above that the material for encapsulating the component 20 is normally different from that used for the electrically insulating layer 28 of the prepreg layers.

In a subsequent method step (see FIGS. 8A and 8B, resp.), through connection holes 44 from the topmost conductive layer 35, 36 are created in an area above the electronic component 20 in a manner familiar to a person skilled in the art. A thin electrically conductive layer is then created, also in a known manner. This layer may be created e.g. by the chemical deposition of, e.g., copper.

A cover layer 46 of electrically conductive material is then applied to the topmost layer 35, 36. The electrically conductive material may also be, e.g., copper. The cover layer is applied e.g. through galvanization such that the through connection holes 44 are completely filled, or at least filled sufficiently in order to ensure that good contact is made with the electronic component 20 beneath. The cover layer may also be applied to the underside (lowest layer 41 or 42). The filling of the through connection holes also results in a change in the material composition of the layers 34, 35, and 36, which can be chosen in a targeted manner in order to adjust the coefficient of thermal expansion to a desired value.

It need hardly be pointed out that the topmost layers 35, 36 are not continuous conducting layers (as the entire circuit arrangement would otherwise be shorted). Rather, these layers—as is clear without further ado to the person skilled in the art—are structured in accordance with a pre-set circuit design; this, however, is not the subject of the invention, and thus need not be further discussed here.

Figure 9:
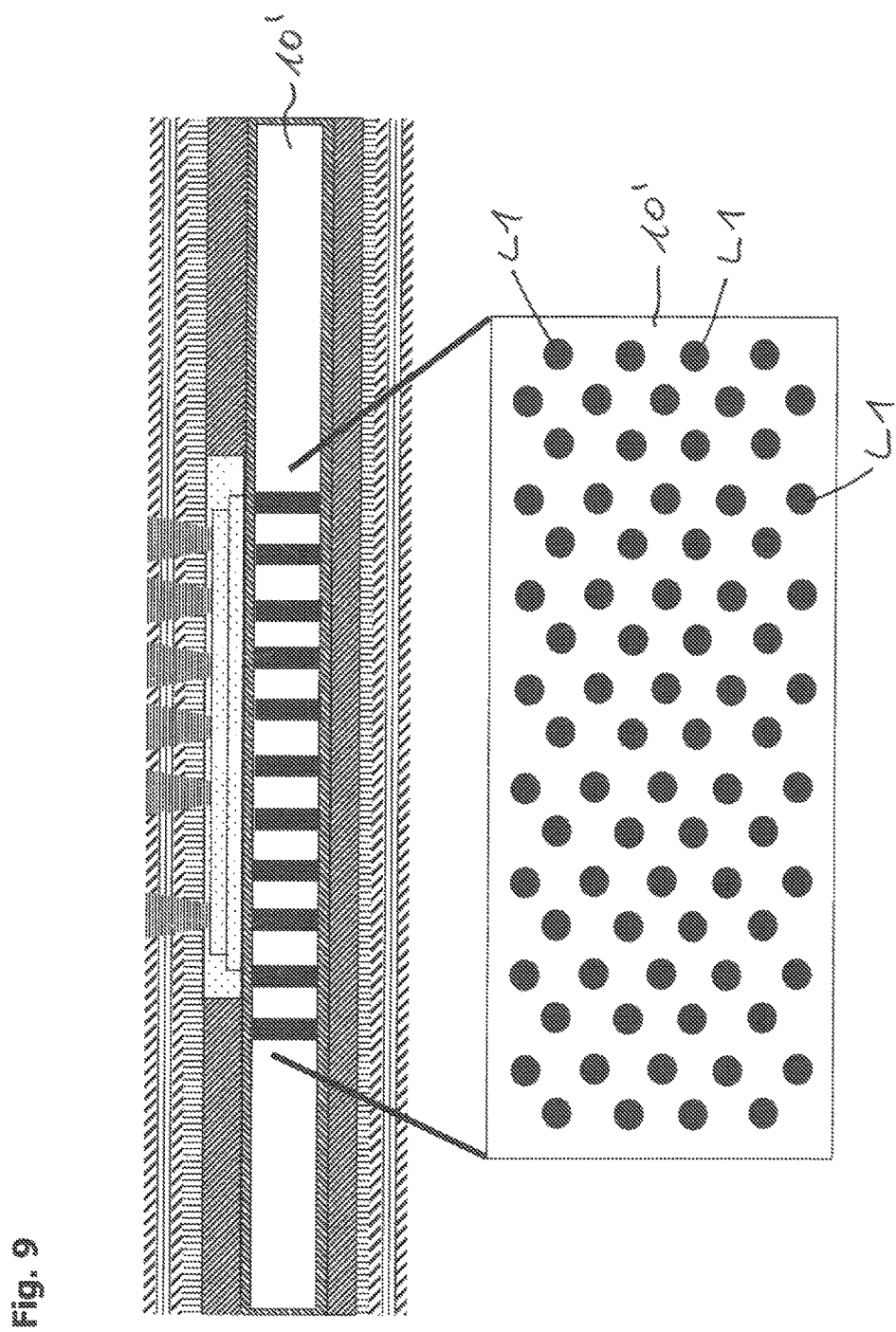
FIG. 9 illustrates an alternative embodiment having a core layer consisting at least in portions of another material.

FIG. 9 illustrates an alternative embodiment of the electronic sub-assembly of FIG. 8B with a core layer (10') consisting at least in portion of another material.

In the alternative embodiment depicted in FIG. 9, an area which consists of another material with a higher coefficient of thermal expansion and electrical conductivity is formed beneath the component 20 of the core layer 10' consisting of an iron-nickel alloy. This measure permits a more precise adjustment of the overall expansion coefficient of the core layer to the expansion coefficient of the component 20, at least in an area beneath the component 20.

The formation of a portion of the core layer from another material may be achieved in various ways. In the exemplary embodiment shown, a section of the core layer 10' underneath the mounting area A is provided with a plurality of holes L1 which are filled during the galvanizing process with copper from the copper layers applied to the core layer 10'.

The alternative embodiment depicted in FIG. 9 combines a low coefficient of thermal expansion in the X-Y plane with increased thermal and electrical conductivity in the Z-axis.

The invention thus offers a person skilled in the art the opportunity, in view of a desired configuration, to coordinate the following parameters: i) coefficient of thermal expansion by selecting the material of the core layer, and ii) determination of the relative thicknesses of the core layer and the conductive layers applied to each side, in interaction with iii) the selection of the thermal conductivity on the Z-axis by incorporating another material into the core layer, in order to most closely adjust the coefficient of thermal expansion of the area underneath the electronic component to the coefficient of thermal expansion of the component itself, while achieving the best possible thermal conductivity in the direction of the Z-axis.

This objective can of course also be achieved by means of a reversed approach, namely by choosing a core layer of a standard material (in particular copper) and achieving the adjustment by incorporating into the core layer materials having a low coefficient of thermal expansion.

Figure 10:
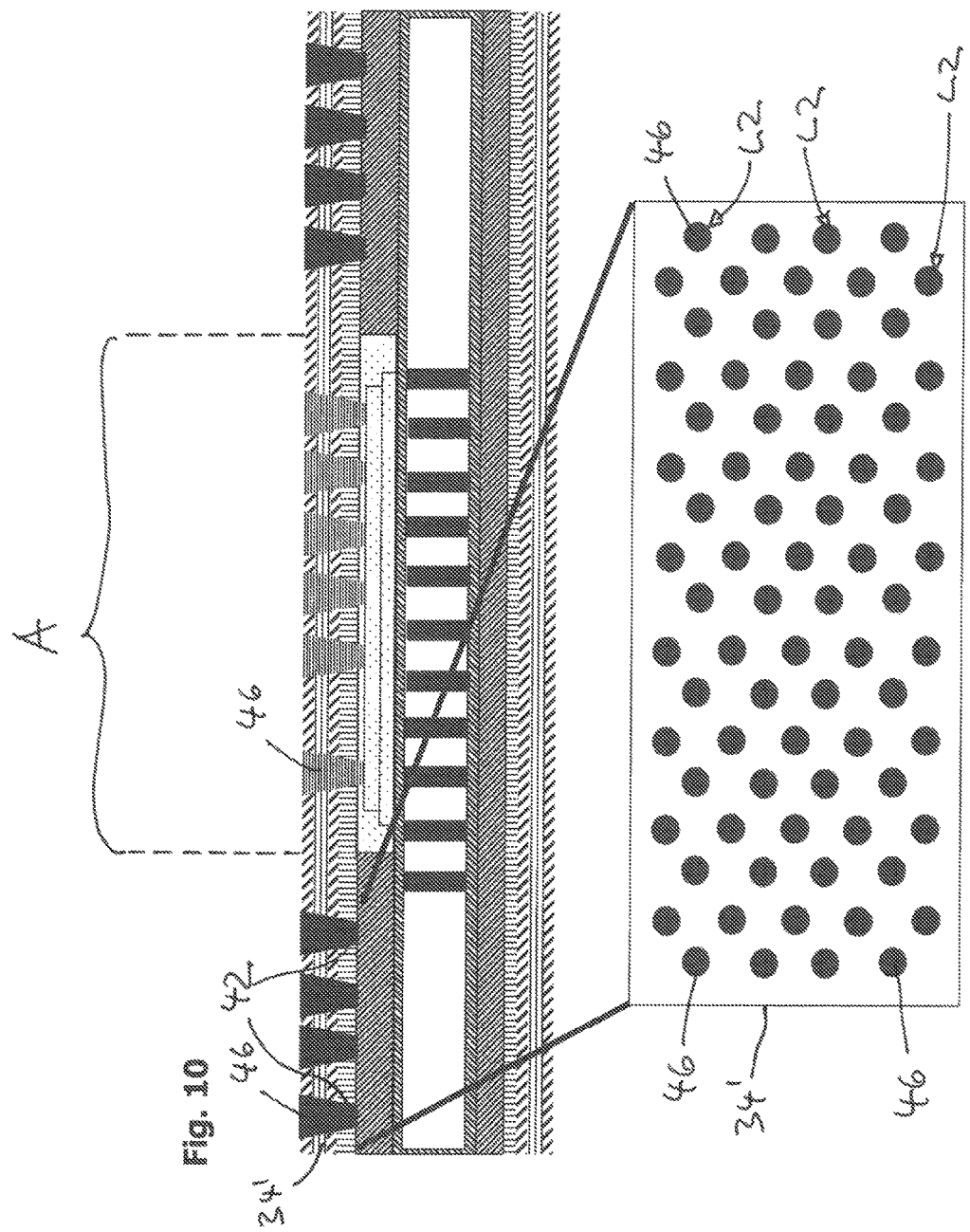
FIG. 10 illustrates an embodiment with through connections for heat dissipation provided outside the mounting area.
Figure 11:
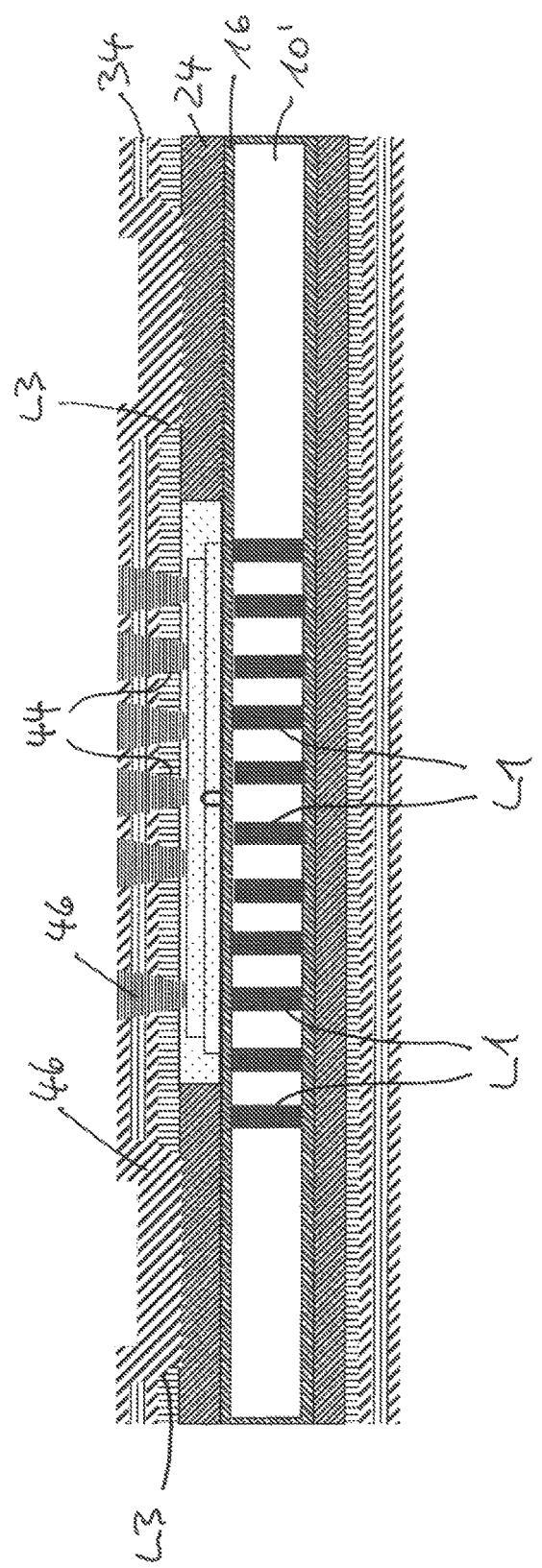
FIG. 11 shows an alternative to the embodiment of FIG. 10.

FIG. 10 depicts a further development of the electronic sub-assembly of FIG. 9, in which holes L2 filled with copper 46 are applied as thermal vias also in the area outside the mounting area A in order to further improve thermal conductivity. Instead of these thermal vias, improvement of thermal conductivity in order to better conduct heat from the upper surface of the electronic sub-assembly can also be achieved by depth milling recesses L3, which are then galvanically filled with copper 46 (cf. FIG. 11). The advantage of this alternative is that depth milling is cheaper than laser drilling.

This setup or design of an electronic sub-assembly in accordance with the invention provides a stable and thermally highly efficient arrangement which, in comparison to comparably efficient ceramic substrates, can be produced significantly more cheaply and with smaller dimensions and have a higher impact resistance and a significantly longer service life or operating life.

The invention claimed is:

1. An electronic sub-assembly comprising:
    a carrier layer of electrically conductive material, the carrier layer having at least one electronic component mounted on at least one mounting area and at least one compensation layer being provided adjacent to the at least one mounting area on the carrier layer, on which the at least one compensation layer an electrically insulating, thermally conductive layer and at least one electrically conductive layer are provided;
    the carrier layer has, at least in one section beneath the at least one mounting area, a coefficient of thermal expansion adjusted to that of the at least one electronic component; and
    the at least one electronic component is encapsulated.

2. The electronic sub-assembly according to claim 1, wherein the carrier layer has a core layer of electrically conductive material with a first layer of electrically conductive material applied to both sides.

3. The electronic sub-assembly according to claim 1, wherein a core layer of the carrier layer is at least in portions of a material differing from that of the core layer.

4. The electronic sub-assembly according to claim 3, wherein the core layer is at least in portions of a material differing from that of the core layer, at least beneath the mounting area.

5. The electronic sub-assembly according to claim 3, wherein the material which differs at least in portions is comprised of holes formed in the core layer and filled with galvanically deposited copper.

6. The electronic sub-assembly according to claim 1, wherein the at least one electrically conductive layer consists of a sequence of layers comprising a first electrically conductive layer, an intermediate layer of a material with a low coefficient of thermal expansion, and a second electrically conductive layer.

7. The electronic sub-assembly according to claim 6, in which the intermediate layer of a material with a low coefficient of thermal expansion is made at least in portions of another material.

8. A method to manufacture an electronic sub-assembly, comprising a carrier layer of electrically conductive material, the carrier layer having at least one electronic component mounted on at least one mounting area and at least one compensation layer being provided adjacent to the at least one mounting area on the carrier layer, on which the at least one compensation layer an electrically insulating, thermally conductive layer and at least one electrically conductive layer are provided; the carrier layer has, at least in one section beneath the at least one mounting area, a coefficient of thermal expansion adjusted to that of the at least one electronic component; and the at least one electronic component is encapsulated, the method comprising the following steps:
   providing a carrier layer having an upper surface and a lower surface, the carrier layer being of a material having a coefficient of expansion adjusted to the coefficient of thermal expansion of an electronic component to be mounted;
   mounting at least one electronic component;
   encapsulating the at least one component;
   applying at least one compensation layer;
   placing at least one prepreg layer and at least one electrically conductive layer; and
   pressing together the sequence of layers so created.

9. The method according to claim 8, wherein the carrier layer comprises a core layer of a material with a low coefficient of thermal expansion, the method further comprising, prior to the step of mounting, the step of applying a first layer of conductive material to the upper surface or the lower surface of the substrate.

10. The method according to claim 8, wherein the carrier layer comprises a core layer of an electrically conductive material with a conventional coefficient of thermal expansion, the method further comprising, prior to the step of mounting, the step of applying a first layer of material with a low coefficient of thermal expansion to the upper surface or the lower surface of the substrate.

11. The method according to claim 8, wherein the core layer is made at least in sections of a material differing from that of the core layer.

12. The method according to claim 8, with the step of making through connections from the upper conducting layer onto the at least one electronic component.

13. The method according to claim 8, with the step of making through connections outside the at least one mounting area.

14. The method according to claim 8, with the additional steps of:
   making at least one recess adjacent to the at least one mounting area;
   filling the at least one recess with conductive material.

15. The method according to claim 14, wherein the at least one recess is created by means of laser drilling and subsequent galvanic plating, or wherein the at least one recess is created by means of depth milling and subsequent galvanic plating.

16. A printed circuit board with an electronic sub-assembly wherein the electronic sub-assembly comprises:
   a carrier layer of electrically conductive material, the carrier layer having at least one electronic component mounted on at least one mounting area and at least one compensation layer being provided adjacent to the at least one mounting area on the carrier layer, on which the least one compensation layer an electrically insulating, thermally conductive layer and at least one electrically conductive layer are provided;
   the carrier layer has, at least in one section beneath the at least one mounting area, a coefficient of thermal expansion adjusted to that of the mounted at least one electronic component; and
   the at least one electronic component is encapsulated.

* * * * *